(12) United States Patent
Sano et al.

(10) Patent No.: US 10,444,263 B2
(45) Date of Patent: Oct. 15, 2019

(54) BATTERY MONITORING SYSTEM

(71) Applicant: SII Semiconductor Corporation, Chiba-shi, Chiba (JP)

(72) Inventors: Kazuaki Sano, Chiba (JP); Toshiyuki Koike, Chiba (JP); Atsushi Sakurai, Chiba (JP); Hiroshi Mukainakano, Ryugasaki (JP)

(73) Assignee: ABLIC INC., Chiba (JP)

( * ) Notice: Subject to any disclaimer, the term of this patent is extended or adjusted under 35 U.S.C. 154(b) by 234 days.

(21) Appl. No.: 15/195,441

(22) Filed: Jun. 28, 2016

(65) Prior Publication Data
US 2017/0003327 A1   Jan. 5, 2017

(30) Foreign Application Priority Data
Jul. 3, 2015   (JP) .................................. 2015-134785

(51) Int. Cl.
| | |
|---|---|
| *G01R 19/165* | (2006.01) |
| *G01R 31/36* | (2019.01) |
| *G01R 31/3835* | (2019.01) |

(52) U.S. Cl.
CPC ... *G01R 19/16542* (2013.01); *G01R 31/3648* (2013.01); *G01R 31/3835* (2019.01)

(58) Field of Classification Search
CPC .......... G01R 31/3606; G01R 19/16542; G01R 31/3658; G01R 31/025; G01R 31/362; G01R 31/3624
See application file for complete search history.

(56) References Cited

U.S. PATENT DOCUMENTS

| | | | | |
|---|---|---|---|---|
| 2008/0164881 | A1* | 7/2008 | Miyamoto | ............ G01R 15/04 324/429 |
| 2009/0125256 | A1* | 5/2009 | Aridome | ............ G01R 31/3835 702/63 |

(Continued)

FOREIGN PATENT DOCUMENTS

| | | |
|---|---|---|
| CN | 102549874 A | 7/2012 |
| JP | 2007-141572 A | 6/2007 |

(Continued)

OTHER PUBLICATIONS

Office Action/Search Report in China application No. 201610507679. 2, dated Sep. 26, 2018, pp. 1-7, including English translation of the Search Report.

(Continued)

*Primary Examiner* — Huy Q Phan
*Assistant Examiner* — Adam S Clarke
(74) *Attorney, Agent, or Firm* — Brinks Gilson & Lione

(57) ABSTRACT

Provided is a battery monitoring system that has a high level of safety even under a state in which characteristics of a reference voltage circuit are deteriorated. The battery monitoring system has a configuration in which: a reference voltage of a first battery monitoring IC is monitored by a second battery monitoring IC; and the second battery monitoring IC outputs, when detecting that the reference voltage reaches a value falling outside a predetermined range, a signal indicating an abnormality of the reference voltage to the first battery monitoring IC, and the first battery monitoring IC stops monitoring of a battery when the signal indicating the abnormality of the reference voltage is input to the first battery monitoring IC.

4 Claims, 3 Drawing Sheets

(56) References Cited

U.S. PATENT DOCUMENTS

| | | | |
|---|---|---|---|
| 2009/0179650 A1* | 7/2009 | Omagari | G01R 31/3624 |
| | | | 324/433 |
| 2010/0308835 A1 | 12/2010 | Sekizaki et al. | |
| 2011/0074435 A1* | 3/2011 | Mizoguchi | G01R 35/00 |
| | | | 324/433 |
| 2012/0001639 A1* | 1/2012 | Mizoguchi | G01R 19/16542 |
| | | | 324/433 |
| 2012/0046893 A1 | 2/2012 | Kaneko et al. | |
| 2012/0182019 A1* | 7/2012 | Nakagawara | G01R 31/3835 |
| | | | 324/426 |
| 2014/0152261 A1* | 6/2014 | Yamauchi | B60L 11/1866 |
| | | | 320/118 |

FOREIGN PATENT DOCUMENTS

| | | |
|---|---|---|
| JP | A-2011-022957 | 2/2011 |
| JP | 2011-250683 A | 12/2011 |
| JP | 4852300 B2 | 1/2012 |

OTHER PUBLICATIONS

Office Action/Search Report in Japanese application No. 2015-134785 dated Feb. 26, 2019, 11 pages, including machine translation obtained by Global Dossier on Apr. 5, 2019.

* cited by examiner

BATTERY MONITORING SYSTEM

RELATED APPLICATIONS

This application claims priority under 35 U.S.C. § 119 to Japanese Patent Application No. 2015-134785 filed on Jul. 3, 2015, the entire content of which is hereby incorporated by reference.

BACKGROUND OF THE INVENTION

1. Field of the Invention

The present invention relates to a battery monitoring system configured to monitor a voltage of a battery.

FIG. 4 is a configuration diagram of a related-art battery monitoring system. The related-art battery monitoring system includes a combination of a primary battery monitoring IC 700 and a secondary battery monitoring IC 600. The primary battery monitoring IC 700 is configured to monitor a voltage, a charge/discharge current, an ambient temperature, and the like of a battery block 400, to thereby detect an abnormality, e.g., an overvoltage state of the battery block 400. The secondary battery monitoring IC 600 has the almost same function as the primary battery monitoring IC 700, and is thus similarly configured to monitor the battery. The related-art battery monitoring system is configured to output detection signals to a host controller 500 from those battery monitoring ICs. The primary battery monitoring IC 700 and the secondary battery monitoring IC 600 each include a reference voltage circuit, and are configured to monitor a voltage and the like of the battery block 400 based on respective reference voltages.

2. Description of the Related Art

When the primary battery monitoring IC 700 cannot normally operate anymore due to troubles and other causes, the secondary battery monitoring IC 600 continues the monitoring operation, thereby enabling the safety of the battery monitoring system to be maintained.

However, there is a problem in that, even when the primary battery monitoring IC 700 or the secondary battery monitoring IC 600 is damaged during its operation, and then the characteristics of the reference voltage circuit are deteriorated, monitoring of the battery may be continued based on a deteriorated reference voltage.

SUMMARY OF THE INVENTION

The present invention has been made in view of the above-mentioned problem, and has an object to provide a battery monitoring system with improved safety.

In order to solve the related-art problem, a battery monitoring system according to one embodiment of the present invention has the following configuration. The battery monitoring system includes: a first battery monitoring IC; and a second battery monitoring IC, the second battery monitoring IC being configured to: monitor a reference voltage of the first battery monitoring IC; and output, when the second battery monitoring IC detects that the reference voltage reaches a value falling outside a predetermined range, a signal indicating an abnormality of the reference voltage to the first battery monitoring IC, the first battery monitoring IC being configured to stop monitoring of the battery when the first battery monitoring IC inputs the signal indicating the abnormality of the reference voltage from the second battery monitoring IC.

The battery monitoring system according to the present invention is configured to detect an abnormality of the reference voltage, and hence the safety of the battery monitoring system can be further improved.

DETAILED DESCRIPTION OF THE PREFERRED EMBODIMENTS

Now, a battery monitoring system according to an embodiment of the present invention is described with reference to the drawings.

Figure 1:
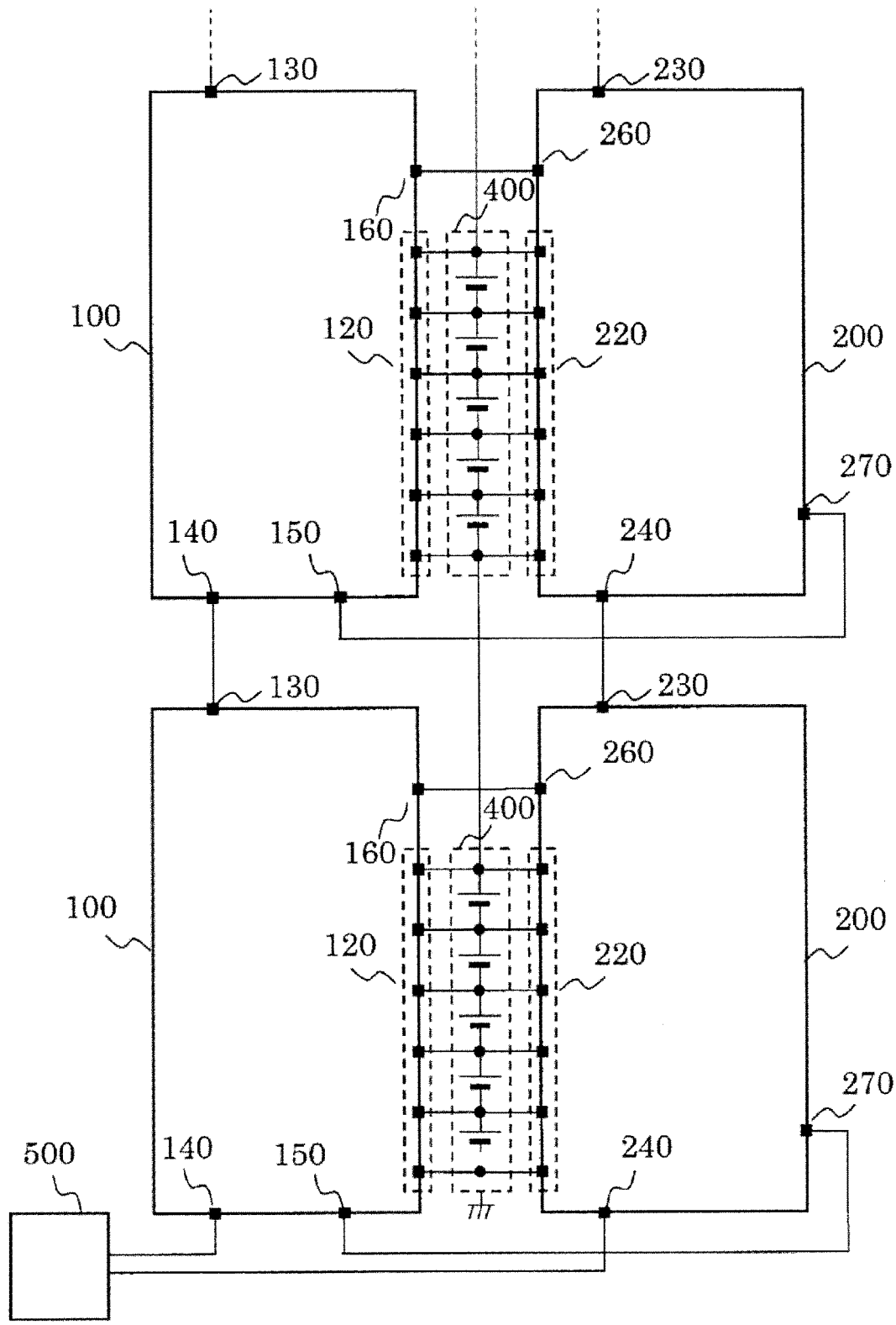
FIG. 1 is a configuration diagram of a battery monitoring system according to an embodiment of the present invention.

FIG. 1 is a configuration diagram of the battery monitoring system of this embodiment.

The battery monitoring system of this embodiment includes first battery monitoring ICs 100, second battery monitoring ICs 200, and battery blocks 400. The battery monitoring system of this embodiment is configured to monitor the battery blocks 400 with the vertically stacked first battery monitoring ICs 100 and the vertically stacked second battery monitoring ICs 200, and output detection signals from the respective ICs located in the lowest stage to a host controller 500.

Figure 2:
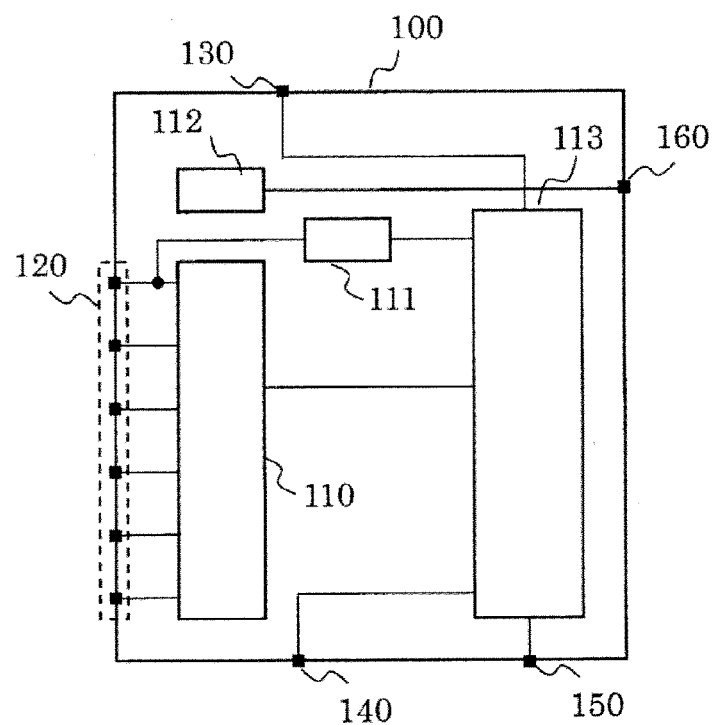
FIG. 2 is a block diagram of a first battery monitoring IC according to this embodiment.

FIG. 2 is a block diagram of the first battery monitoring IC according to this embodiment.

The first battery monitoring IC 100 includes a battery voltage monitoring circuit 110, a battery block voltage monitoring circuit 111, a reference voltage circuit 112, a logic circuit 113, a battery voltage monitoring terminal 120, an input terminal 130, an output terminal 140, an input terminal 150, and a reference voltage output terminal 160.

Figure 3:
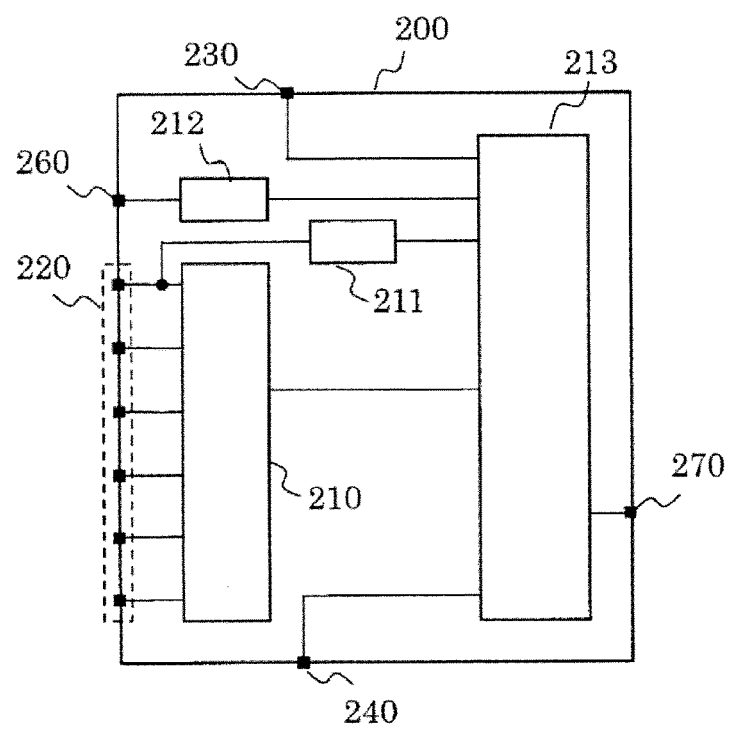
FIG. 3 is a block diagram of a second battery monitoring IC according to this embodiment.
Figure 4:
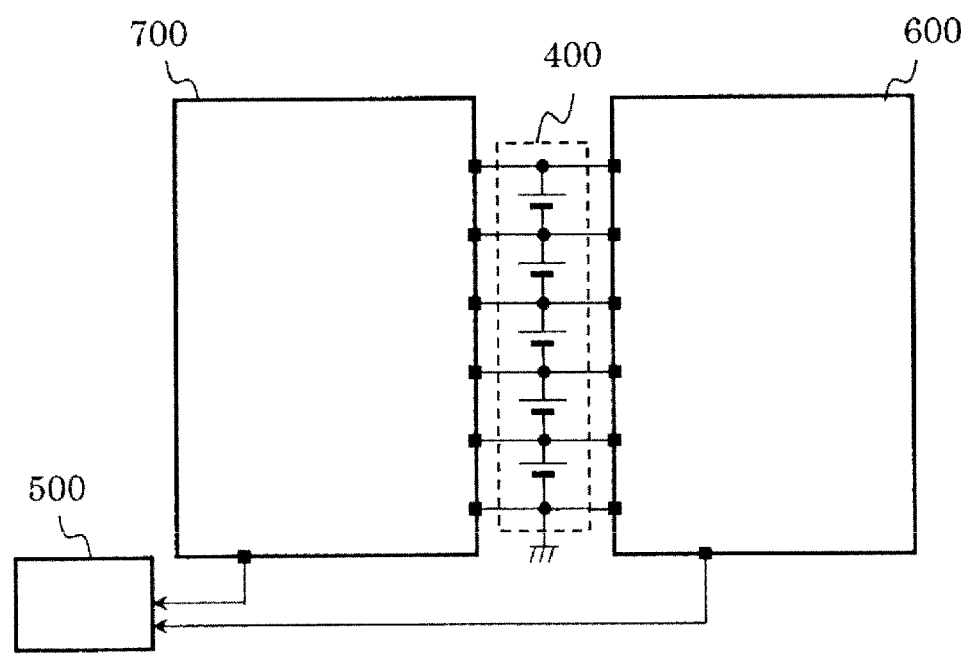
FIG. 4 is a configuration diagram of a related-art battery monitoring system.

FIG. 3 is a block diagram of the second battery monitoring IC according to this embodiment.

The second battery monitoring IC 200 includes a battery voltage monitoring circuit 210, a battery block voltage monitoring circuit 211, an external reference voltage monitoring circuit 212, a logic circuit 213, a battery voltage monitoring terminal 220, an input terminal 230, an output terminal 240, an reference voltage input terminal 260, and an output terminal 270. Further, the second battery monitoring IC 200 also includes a reference voltage circuit (not shown).

The battery voltage monitoring terminals 120 and 220 are connected to the battery block 400. The input terminal 130 of the first battery monitoring IC 100 is connected to the output terminal 140 of the first battery monitoring IC 100 located upstream thereof. The output terminal 140 of the first battery monitoring IC 100 is connected to the input terminal 130 of the first battery monitoring IC 100 located downstream thereof or the host controller 500. The input terminal 150 of the first battery monitoring IC 100 is connected to the output terminal 270 of the second battery monitoring IC 200. The reference voltage output terminal 160 of the first battery monitoring IC 100 is connected to the reference voltage input terminal 260 of the second battery monitoring IC 200. The input terminal 230 of the second battery monitoring IC 200 is connected to the output terminal 240 of the second battery monitoring IC 200 located upstream thereof. The output terminal 240 of the second battery monitoring IC 200 is connected to the input terminal 230 of the second battery monitoring IC 200 located downstream thereof or the host controller 500.

Internal connections of the first battery monitoring IC 100 are described.

The reference voltage circuit 112 configured to generate a reference voltage to be used in internal circuits is connected to the reference voltage output terminal 160. The battery voltage monitoring circuit 110 and the battery block voltage monitoring circuit 111 are connected to the battery voltage monitoring terminal 120, and have output terminals connected to the logic circuit 113. The logic circuit 113 is connected to the input terminal 130, the output terminal 140, and the input terminal 150.

Internal connections of the second battery monitoring IC 200 are described.

The battery voltage monitoring circuit 210 and the battery block voltage monitoring circuit 211 are connected to the battery voltage monitoring terminal 220, and have output terminals connected to the logic circuit 213. The external reference voltage monitoring circuit 212 is connected to the reference voltage input terminal 260, and has an output terminal connected to the logic circuit 213. The logic circuit 213 is connected to the input terminal 230, the output terminal 240, and the output terminal 270.

The external reference voltage monitoring circuit 212 of the second battery monitoring IC 200 is configured to monitor the reference voltage of the first battery monitoring IC 100. The battery voltage monitoring circuits 110 and 210 are configured to monitor voltages of respective batteries of the battery block 400. The battery block voltage monitoring circuits 111 and 211 are configured to monitor a total voltage of the battery block 400. The logic circuit 113 of the first battery monitoring IC 100 is configured to output a signal indicating an abnormality to the output terminal 140 when receiving a signal indicating an abnormality, e.g., overvoltage, from the battery voltage monitoring circuit 110, the battery block voltage monitoring circuit 111, or the input terminal 130. In addition, the logic circuit 113 is configured to stop monitoring of a voltage of the battery block 400 and continuously output a signal indicating normal to the output terminal 140 when the logic circuit 113 receives a signal indicating an abnormality of an external reference voltage from the input terminal 150, for example. The logic circuit 213 of the second battery monitoring IC 200 is configured to output a signal indicating an abnormality to the output terminal 240 when receiving a signal indicating an abnormality, e.g., overvoltage, from the battery voltage monitoring circuit 210, the battery block voltage monitoring circuit 211, or the input terminal 230. In addition, the logic circuit 213 is configured to output a signal indicating an abnormality to the output terminal 270 when receiving a signal indicating an abnormality of an external reference voltage from the external reference voltage monitoring circuit 212.

Next, operation of the battery monitoring system of this embodiment is described.

The first battery monitoring IC 100 monitors, with reference to a reference voltage of the reference voltage circuit 112, a voltage of each battery of the battery block 400 connected to the battery voltage monitoring terminal 120. Then, when detecting an abnormality, e.g., overvoltage in any of the batteries included in the battery block 400, the first battery monitoring IC 100 outputs a detection signal indicating an abnormality to the output terminal 140. For example, when the first battery monitoring IC 100 that has detected an abnormality is connected in a second stage, a detection signal output to the output terminal 140 is input to the input terminal 130 of the first battery monitoring IC 100 connected in the subsequent stage. The first battery monitoring IC 100 that has received the detection signal at the input terminal 130 similarly outputs a detection signal to the output terminal 140. Thus, a detection signal eventually reaches the first battery monitoring IC 100 connected in the lowest stage regardless of which battery block 400 of the plurality of battery blocks 400, which are connected in series, a battery abnormality is detected in. Then, the battery monitoring system outputs the detection signal to the host controller 500.

Basic operation of the second battery monitoring IC 200 is similar to that of the first battery monitoring IC 100. Specifically, the second battery monitoring IC 200 monitors a voltage of each battery of the battery block 400, and outputs a detection signal to the host controller 500 when detecting an abnormality. Thus, even if the detection function of the first battery monitoring IC 100 is lost, the detection function for the battery monitoring system can be maintained by the second battery monitoring IC 200.

Now, a description is given of a case in which the first battery monitoring IC 100 normally functions and the reference voltage characteristics of the reference voltage circuit 112 are deteriorated.

In this state, the detection function of the first battery monitoring IC 100 is not lost, and hence the first battery monitoring IC 100 monitors a voltage of the battery block 400 based on an abnormal reference voltage. At this time, the external reference voltage monitoring circuit 212 of the second battery monitoring IC 200 detects the deterioration in reference voltage of the reference voltage circuit 112 of the first battery monitoring IC 100. Then, the second battery monitoring IC 200 outputs a signal indicating an abnormality to the output terminal 270 when the reference voltage of the reference voltage circuit 112 reaches a value falling outside a predetermined range. For example, the second battery monitoring IC 200 that has detected an abnormality of the reference voltage is connected in the second stage, a signal output to the output terminal 270 is input to the input terminal 150 of the first battery monitoring IC 100 connected in the second stage.

When the logic circuit 113 of the first battery monitoring IC 100 receives, at the input terminal 150, the signal indicating the abnormality output to the output terminal 270 of the second battery monitoring IC 200, for example, the logic circuit 113 stops monitoring of the voltage of the battery block 400 and continuously outputs a signal indicating normal to the output terminal 140. The first battery monitoring IC 100 operates in this way so as not to monitor a voltage of the battery block 400 based on an abnormal reference voltage. In short, the battery monitoring system does not perform erroneous detection.

As described above, according to the battery monitoring system of the present invention, the battery monitoring system does not perform erroneous detection even under a state in which the first battery monitoring IC 100 normally functions and in which the reference voltage characteristics are deteriorated. Thus, the safety of the battery monitoring system can be further improved.

The first battery monitoring IC 100 is configured to stop monitoring of a voltage of the battery block 400 when receiving a signal indicating an abnormality at the input terminal 150, and a detection signal of the input terminal 130 may be output to the output terminal 140.

Further, in this embodiment, although the second battery monitoring IC 200 is configured to monitor the reference voltage of the first battery monitoring IC 100, the first battery monitoring IC 100 may be configured to monitor the reference voltage of the second battery monitoring IC 200, or the first and second battery monitoring ICs 100 and 200 may be configured to mutually monitor the respective reference voltages. The first and second battery monitoring ICs 100 and 200 that are configured to mutually monitor the respective reference voltages may further be configured to output, when abnormalities are detected in both the reference voltages, abnormality detection signals to the host controller 500. With this, the safety of the battery monitoring system can be improved.

What is claimed is:

1. A battery monitoring system, comprising:
   a battery;
   a first battery monitoring circuit having a battery voltage monitoring terminal electrically connected to the battery; and
   a second battery monitoring circuit having a battery voltage monitoring terminal electrically connected to the battery and electrically interconnected with the first battery monitoring circuit,
   the second battery monitoring circuit configured to:
      monitor a reference voltage of the first battery monitoring circuit; and
      output a signal indicating an abnormality of the reference voltage to the first battery monitoring circuit when the second battery monitoring circuit detects that the reference voltage has a value outside a predetermined range,
   wherein the first battery monitoring circuit is configured to stop monitoring the battery after the first battery monitoring circuit receives the signal indicating the abnormality of the reference voltage from the second battery monitoring circuit.

2. The battery monitoring system according to claim 1, wherein the first battery monitoring circuit includes a reference voltage output terminal for outputting the reference voltage, and an input terminal for receiving the signal indicating the abnormality of the reference voltage, and
   wherein the second battery monitoring circuit includes an external reference voltage input terminal for receiving the reference voltage, an external reference voltage monitoring circuit configured to detect the abnormality of the reference voltage, and an output terminal for outputting the signal indicating the abnormality of the reference voltage.

3. The battery monitoring system according to claim 1, wherein the first battery monitoring circuit is configured to:
   monitor a reference voltage of the second battery monitoring circuit; and
   output a signal indicating an abnormality of the reference voltage to the second battery monitoring circuit when the first battery monitoring circuit detects that the reference voltage has a value outside a predetermined range, and
   wherein the second battery monitoring circuit is configured to stop monitoring the battery when the second battery monitoring circuit receives the signal indicating the abnormality of the reference voltage from the first battery monitoring circuit.

4. The battery monitoring system according to claim 3, wherein the first battery monitoring circuit includes:
   a reference voltage output terminal that outputs the reference voltage;
   an input terminal that receives a signal indicating the abnormality of the reference voltage of the first battery monitoring circuit;
   an external reference voltage input terminal that receives the reference voltage of the second battery monitoring circuit;
   an external reference voltage monitoring circuit configured to detect the abnormality of the reference voltage of the second battery monitoring circuit; and
   an output terminal that outputs a signal indicating the abnormality of the reference voltage of the second battery monitoring circuit, and
   wherein the second battery monitoring circuit includes:
   a reference voltage output terminal that outputs the reference voltage;
   an input terminal that receives a signal indicating the abnormality of the reference voltage of the second battery monitoring circuit;
   an external reference voltage input terminal that receives the reference voltage of the first battery monitoring circuit;
   an external reference voltage monitoring circuit configured to detect the abnormality of the reference voltage of the first battery monitoring circuit; and
   an output terminal that outputs a signal indicating the abnormality of the reference voltage of the first battery monitoring circuit.

* * * * *